(12) United States Patent
Yeh

(10) Patent No.: US 9,872,393 B2
(45) Date of Patent: Jan. 16, 2018

(54) METHOD FOR MAKING A CIRCUIT BOARD

(71) Applicants: Avary Holding (Shenzhen) Co., Limited, Shenzhen (CN); HongQiSheng Precision Electronics (QinHuangDao) Co., Ltd., Qinhuangdao (CN); GARUDA TECHNOLOGY CO., LTD., New Taipei (TW)

(72) Inventor: Tzu-Chien Yeh, New Taipei (TW)

(73) Assignees: Avary Holding (Shenzhen) Co., Limited, Shenzhen (CN); HongQiSheng Precision Electronics (QinHuangDao) Co., Ltd., Qinhuangdao (CN); GARUDA TECHNOLOGY CO., LTD., New Taipei (TW)

( * ) Notice: Subject to any disclaimer, the term of this patent is extended or adjusted under 35 U.S.C. 154(b) by 39 days.

(21) Appl. No.: 14/886,581

(22) Filed: Oct. 19, 2015

(65) Prior Publication Data
US 2016/0366766 A1 Dec. 15, 2016

(30) Foreign Application Priority Data
Jun. 10, 2015 (CN) .......................... 2015 1 0317497

(51) Int. Cl.
*H01K 3/10* (2006.01)
*H05K 1/18* (2006.01)
(Continued)

(52) U.S. Cl.
CPC ........... *H05K 1/184* (2013.01); *H05K 1/0298* (2013.01); *H05K 1/0313* (2013.01); *H05K 1/092* (2013.01);
(Continued)

(58) Field of Classification Search
CPC ........ H05K 1/184; H05K 1/115; H05K 1/111; H05K 1/0298; H05K 1/092; H05K 3/188;
(Continued)

(56) References Cited

U.S. PATENT DOCUMENTS 8,291,584 B2 * 10/2012 Tanaka .............. H01L 23/49827
29/832
8,347,493 B2 * 1/2013 Taniguchi ........... H01L 23/3107
29/832
9,320,185 B2 * 4/2016 Imamura ............ H05K 13/0023

FOREIGN PATENT DOCUMENTS

TW 201424501 A 6/2014

* cited by examiner

*Primary Examiner* — Donghai D Nguyen
(74) *Attorney, Agent, or Firm* — ScienBiziP, P.C.

(57) ABSTRACT

A circuit board includes a core layer, at least one passive component, a first and a second conductive wire layers, at least one contact pad, and a resin packing layer. The core layer defines at least one through hole to receive the passive component. The first and the second conductive wire layers are connected to two opposite surfaces of the core layer. Each contact pad is positioned between and connected to one passive component and the first conductive wire layer. The resin packing layer is filled among the core layer, each passive component, each contact pad, the first and the second conductive wire layers. The resin packing layer can connect the first and the second conductive wire layers to the core layer, and connect the core layer, each passive component, and each contact pads to each other.

5 Claims, 12 Drawing Sheets

(51) Int. Cl.
*H05K 1/11* (2006.01)
*H05K 1/02* (2006.01)
*H05K 1/09* (2006.01)
*H05K 1/03* (2006.01)
*H05K 3/18* (2006.01)
*H05K 3/46* (2006.01)
*H05K 3/40* (2006.01)

(52) U.S. Cl.
CPC .............. *H05K 1/111* (2013.01); *H05K 1/115* (2013.01); *H05K 3/188* (2013.01); *H05K 3/4038* (2013.01); *H05K 3/4644* (2013.01); *H05K 3/4697* (2013.01); *H05K 2201/0203* (2013.01); *H05K 2201/09545* (2013.01); *Y10T 29/49165* (2015.01)

(58) Field of Classification Search
CPC .. H05K 3/4697; H05K 3/4644; H05K 3/4038; H05K 1/0313; H05K 2201/0203; H05K 2201/09545; Y10T 29/49126; Y10T 29/4913; Y10T 29/49144; Y10T 29/49146; Y10T 29/49155; Y10T 29/49165
USPC .................. 29/830, 832, 840, 841, 846, 852
See application file for complete search history.

US 9,872,393 B2

METHOD FOR MAKING A CIRCUIT BOARD

FIELD

The subject matter herein generally relates to a circuit board, a method for making the circuit board, and a portable electronic device employing the circuit board.

BACKGROUND

Many portable electronic devices, such as cell phones, tablet computers, or multimedia players, usually include circuit boards. Passive components of a circuit board, such as resistors or capacitors, are usually embedded in a substrate of the circuit board in order to decrease the thickness of the portable electronic device. During manufacturing, the passive components are disposed between two resin layers, and the two resin layers are pressed and connected to each other, thereby embedding the passive components in the two resin layers.

BRIEF DESCRIPTION OF THE DRAWINGS

Implementations of the present technology will now be described, by way of example only, with reference to the attached figures.

DETAILED DESCRIPTION

Figure 1:
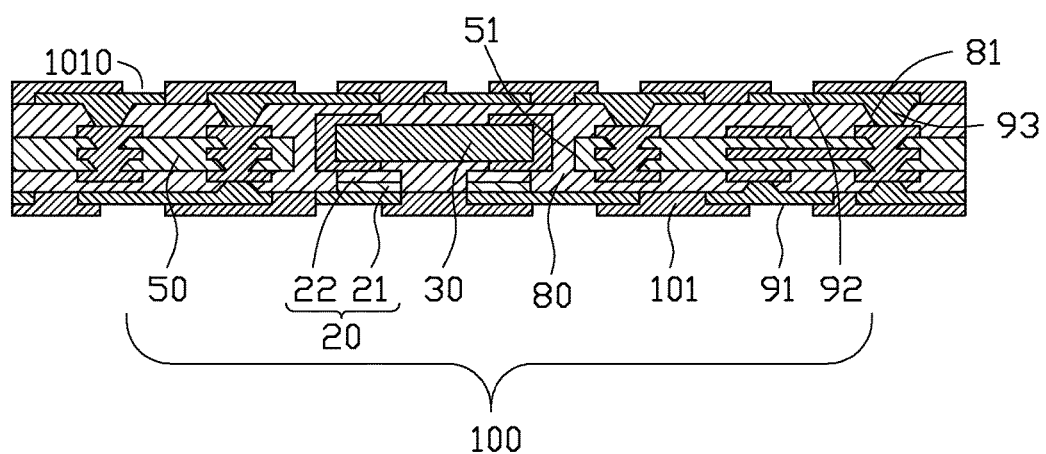
FIG. 1 is a diagrammatic view of an embodiment of a circuit board according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series and the like.

FIG. 1 illustrates an embodiment of a circuit board 100 comprising a core layer 50, at least one passive component 30, a first conductive wire layer 91, a second conductive wire layer 92, at least one contact pad 20, and two solder mask layers 101. The core layer 50 defines at least one through hole 51, and comprises a first surface and a second surface opposite to the first surface. Each passive component 30 is received in one through hole 51. The first conductive wire layer 91 and the second conductive wire layer 92 are respectively connected to the first surface and the second surface of the core layer 50. Each contact pad 20 is positioned between and connected to one passive component 30 and the first conductive wire layer 91. One solder mask layer 101 is connected to a surface of the first conductive wire layer 91 away from the core layer 50. The other solder mask layer 101 is connected to a surface of the second conductive wire layer 92 away from the core layer 50. The at least one passive component 30 may be a resistor, a capacitor, or an inductance.

The circuit board 100 further comprises a resin packing layer 80 filled in among the core layer 50, the at least one passive component 30, the at least one contact pad 20, the first conductive wire layer 91, and the second conductive wire layer 92. The resin packing layer 80 is configured to connect the first conductive wire layer 91 and the second conductive wire layer 92 to the first and the second surfaces of the core layer 50. The resin packing layer 80 is further configured to connect the core layer 50, the at least one passive component 30, and the at least one contact pad 20 to each other. The at least one contact pad 20 is configured to connect the at least one passive component 30 to the first conductive wire layer 91, thereby preventing the at least one passive component 30 from being moved during a manufacturing process of the circuit board 100.

Each of the at least one contact pad 20 is made of conductive material. In at least one embodiment, each of the at least one contact pad 20 comprises an electro-plating layer 21 connected to the first conductive wire layer 91 and a conductive paste layer 22 positioned between and connected to one of the at least one passive component 30 and the electro-plating layer 21. The electro-plating layer 21 is made of copper or aluminum. The conductive paste layer 22 is made of conductive paste consisting of conductive powder (or silver powder) and lipids. In another embodiment, the conductive paste layer 22 may be omitted. The at least one passive component 30 is connected to the at least one contact pad 20 via a solder (not shown). In yet another embodiment, the electro-plating layer 21 may be omitted.

The resin packing layer 80 is made of an adhesive resin composition. The adhesive resin composition comprises adhesive resin selected from a group consisting of polypropylene (PP), epoxy resin, polyurethane (PU), phenolic resin, urea-formaldehyde resin, melamine-formaldehyde resin, and polyimide, or any combination thereof.

The first conductive wire layer 91 and the second conductive wire layer 92 are made of copper. Each of the first conductive wire layer 91 and the second conductive wire layer 92 comprises a number of conductive portions 93 protruding towards the core layer 50. The first conductive wire layer 91 and the second conductive wire layer 92 are electrically connected to the core layer 50 via the conductive portions 93. In at least one embodiment, a number of plating holes 81 are defined through a portion of the resin packing layer 80. Each conductive portion 93 is formed in one plating hole 81, thereby causing the first conductive wire layer 91 and the second conductive wire layer 92 to be electrically connected to the core layer 50 via the conductive portion 93. In at least one embodiment, the conductive portion 93 is made of copper or aluminum.

Each solder mask layer 101 is made of liquid photoimageable material. A number of openings 1010 are defined in each solder mask layer 101. Portions of the first conductive wire layer 91 and portions of the second conductive wire layer 92 are exposed via the openings 1010, thereby allowing the first conductive wire layer 91 and the second conductive wire layer 92 to be electrically connected to external electric components (not shown).

In other embodiments, the circuit board 100 may further comprise a few more conductive wire layers (not shown) connected to each of the first conductive wire layer 91 and the second conductive wire layer 92 and facing away from the core layer 50. The solder mask layer 101 is connected to an exterior one of the conductive wire layers.

Figure 2:
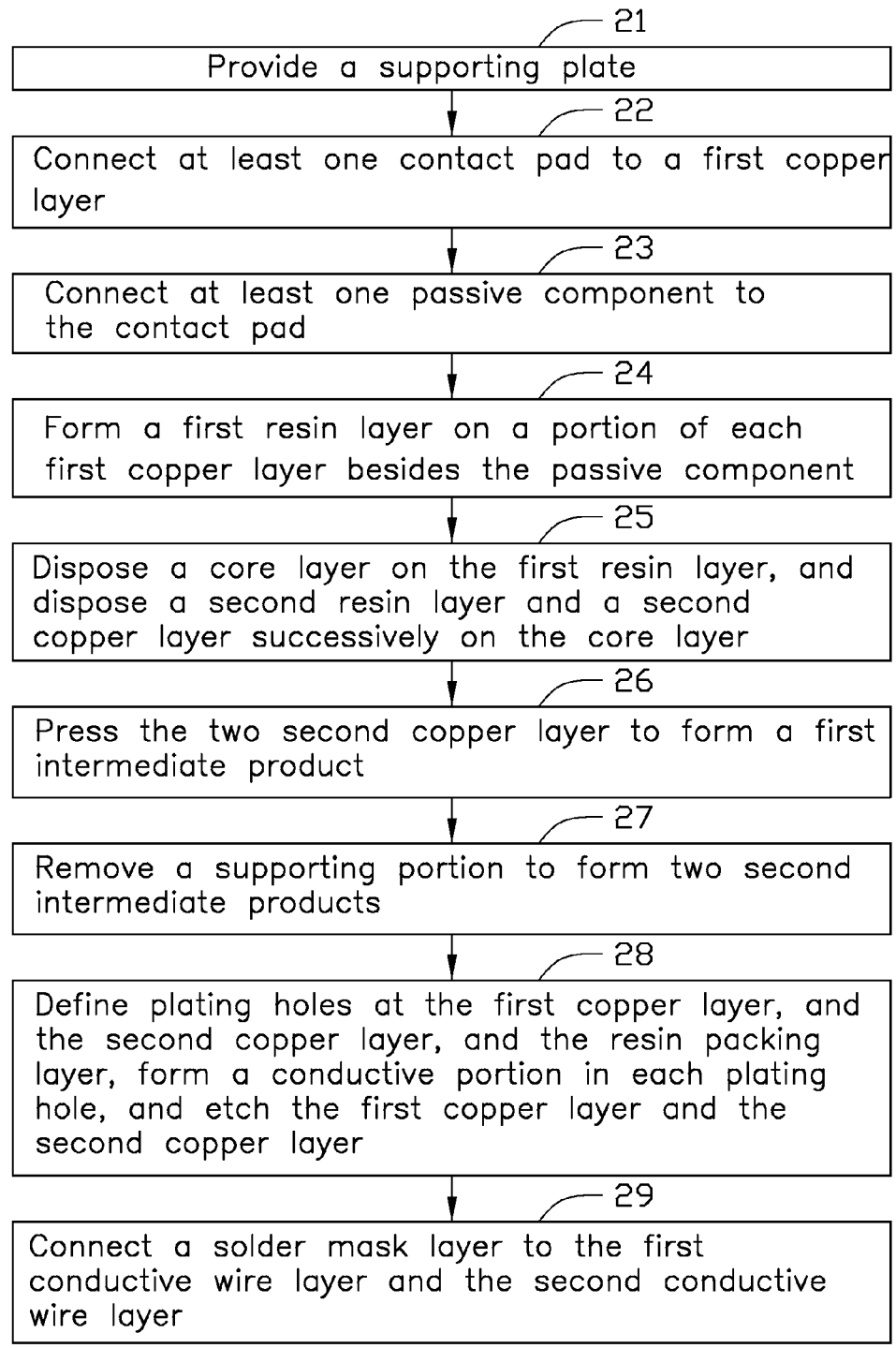
FIG. 2 is a flowchart of an embodiment of a method for making a circuit board according to the present disclosure.

Referring to FIG. 2, a flowchart for making the circuit board 100 is presented in accordance with an example embodiment which is being thus illustrated. The example method for making the circuit board 100 is provided by way of example, as there are a variety of ways to carry out the method. The method described below can be carried out using the configurations illustrated in FIG. 1, for example, and various elements of these figures are referenced in explaining the example method. Each block shown in FIG. 2 represents one or more processes, methods or subroutines, carried out in the exemplary method. Furthermore, the illustrated order of blocks is by example only and the order of the blocks can change according to the present disclosure. Additional blocks may be added or fewer blocks may be utilized, without departing from this disclosure. The exemplary method can begin at block 21.

Figure 3:
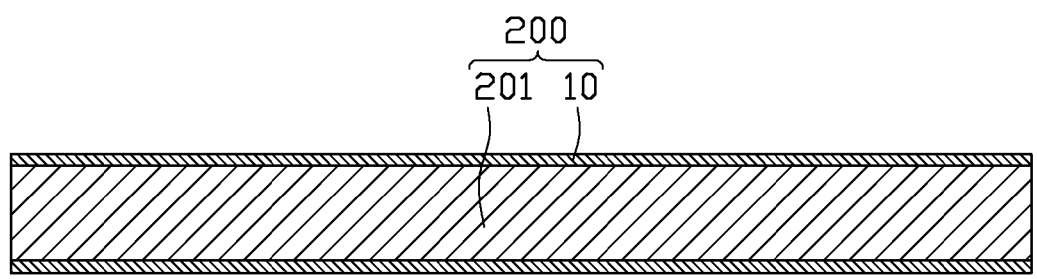
FIG. 3 is a diagrammatic view of a supporting plate comprising a supporting portion and two first copper layers connected to the supporting portion used in the method of FIG. 2.

At block 21, a supporting plate 200 (shown in FIG. 3) is provided. The supporting plate 200 comprises a supporting portion 201 and two first copper layers 10. The two first copper layers 10 are respectively connected to two opposite surfaces of the supporting portion 201.

Figure 4:
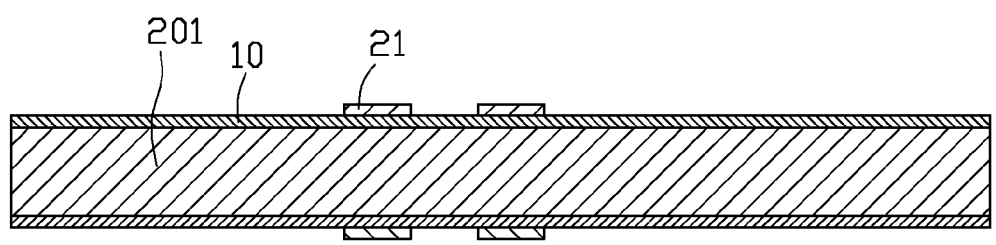
FIG. 4 is a diagrammatic view showing an electro-plating layer being formed on the supporting plate of FIG. 3.
Figure 5:
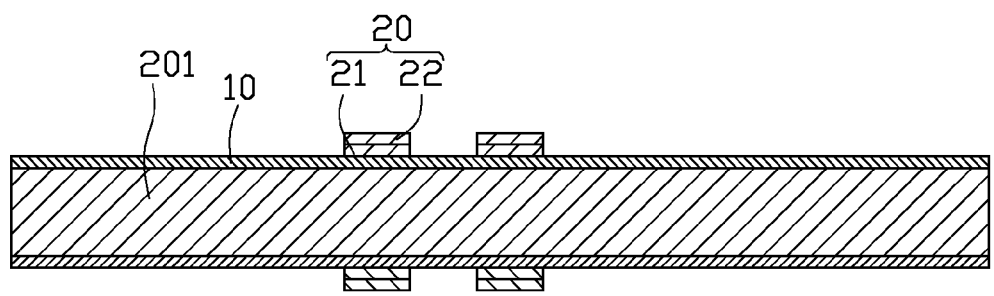
FIG. 5 is a diagrammatic view showing a conductive paste layer being formed on the supporting plate of FIG. 3.

At block 22, at least one contact pad 20 (FIGS. 4 and 5) is connected to a surface of each first copper layer 10 away from the supporting portion 201. In at least one embodiment, an electro-plating layer 21 (shown in FIG. 4) is formed on the surface of the first copper layer 10 by electro-plating, and a conductive paste layer 22 (shown in FIG. 5) is formed on a surface of the electro-plating layer 21 away from the first copper layer 10 by coating a conductive paste (not shown), thereby forming the contact pad 22 comprising the electro-plating layer 21 and the conductive paste layer 22. In another embodiment, an electro-plating layer 21 is formed on the surface of the first copper layer 10, thereby forming the contact pad 20 only comprising the electro-plating layer 21. In yet another embodiment, a conductive paste layer 22 is formed on the surface of the first copper layer 10, thereby forming the contact pad 20 only comprising the conductive paste layer 22.

Figure 6:
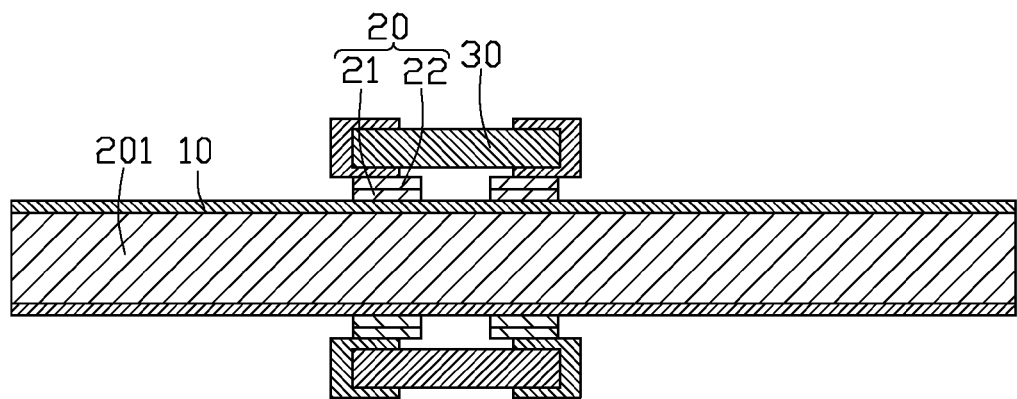
FIG. 6 is a diagrammatic view showing at least one passive component and at least one contact pad being formed on the conductive paste layer of FIG. 5.

At block 23, at least one passive component 30 (shown in FIG. 6) is connected to a surface of the contact pad 20 away from the first copper layer 10. When the contact pad 20 comprises the electro-plating layer 21 and the conductive paste layer 22, the passive component 30 is connected to the conductive paste layer 22. When the contact pad 20 only comprises the electro-plating layer 21, the passive component 30 is directly connected to the contact pad 20 via a solder paste (not shown). When the contact pad 20 only comprises the conductive paste layer 22, the passive component 30 is directly connected to the conductive paste layer 22.

Figure 7:
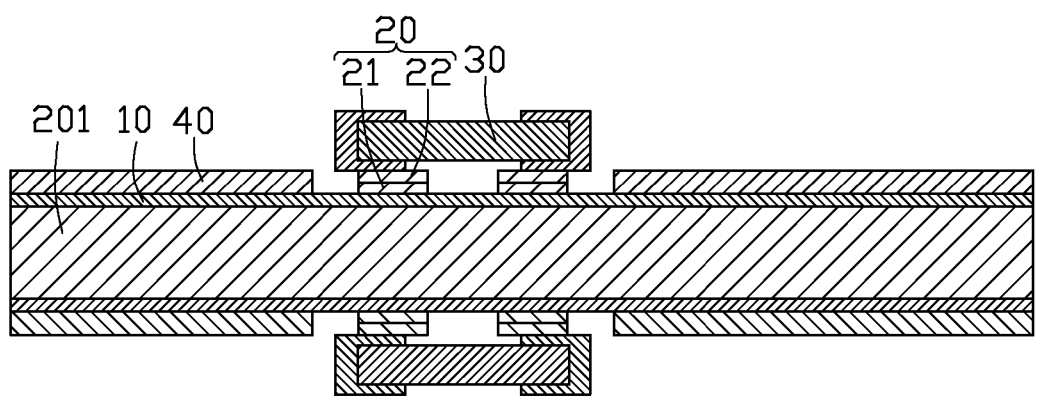
FIG. 7 is a diagrammatic view showing a first resin layer being formed on the first copper layer of FIG. 6.

At block 24, a first resin layer 40 (shown in FIG. 7) is formed on a portion of each first copper layer 10 besides the passive component 30. The first resin layer 40 is made of an adhesive resin composition. The adhesive resin composition comprises adhesive resin selected from a group consisting of PP, PU, phenolic resin, urea-formaldehyde resin, melamine-formaldehyde resin, and polyimide, or any combination thereof.

Figure 8:
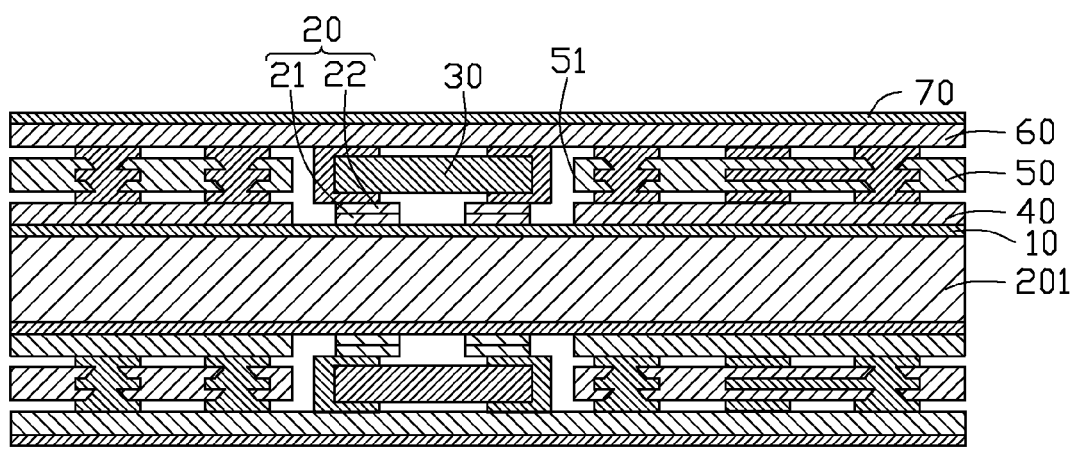
FIG. 8 is a diagrammatic view showing a core layer, a second resin layer, and a second copper layer being formed on the first resin layer of FIG. 7.

At block 25, a core layer 50 (shown in FIG. 8) defining at least one through hole 51 is disposed on a surface of each first resin layer 40 away from the first copper layer 10 to allow the passive component 30 to be received in the through hole 51, and a second resin layer 60 and a second copper layer 70 are successively disposed on each core layer 50 and the passive component 30. The second resin layer 60 is made of an adhesive resin composition. The adhesive resin composition comprises adhesive resin selected from a group consisting of PP, PU, phenolic resin, urea-formaldehyde resin, melamine-formaldehyde resin, and polyimide, or any combination thereof. The adhesive resin composition of the second resin layer 60 may be the same as that of the first resin layer 40.

Figure 9:
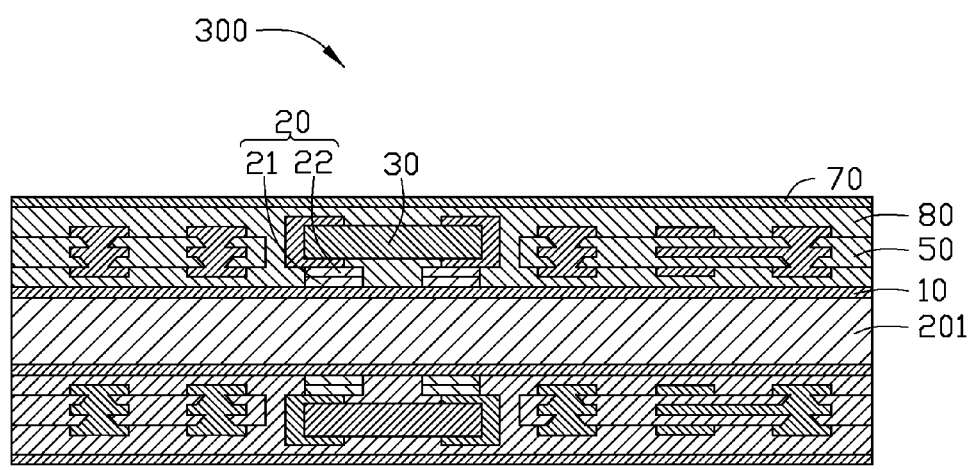
FIG. 9 is a diagrammatic view of a first intermediate product formed by pressing the first copper layer, the first resin layer, the core layer, the passive component, the contact pad, the second resin layer, and the second copper layer of FIG. 8.

At block 26, the two second copper layer 70 (shown in FIG. 9) are pressed, thereby causing the supporting portion 201, the first copper layer 10, the contact pad 20, the passive component 30, the first resin layer 40, the core layer 50, the second resin layer 60, and the second copper layer 70 to be connected to each other to form a first intermediate product 300. In at least one embodiment, the adhesive resin composition of the first resin layer 40 and the second resin layer 60 flows to fill gaps between the first copper layer 10, the contact pad 20, the passive component 30, the core layer 50, and the second copper layer 70, thereby causing the first resin layer 40 and the second resin layer 60 to be connected to each other to from the resin packing layer 80. Since the passive component 30 is connected to the contact pad 20, the passive component 30 cannot move when the two second copper layers 70 are pressed. Furthermore, the pressing of the second copper layers 70 may prevent bubbles from being generated in the resin packing layer 80.

Figure 10:
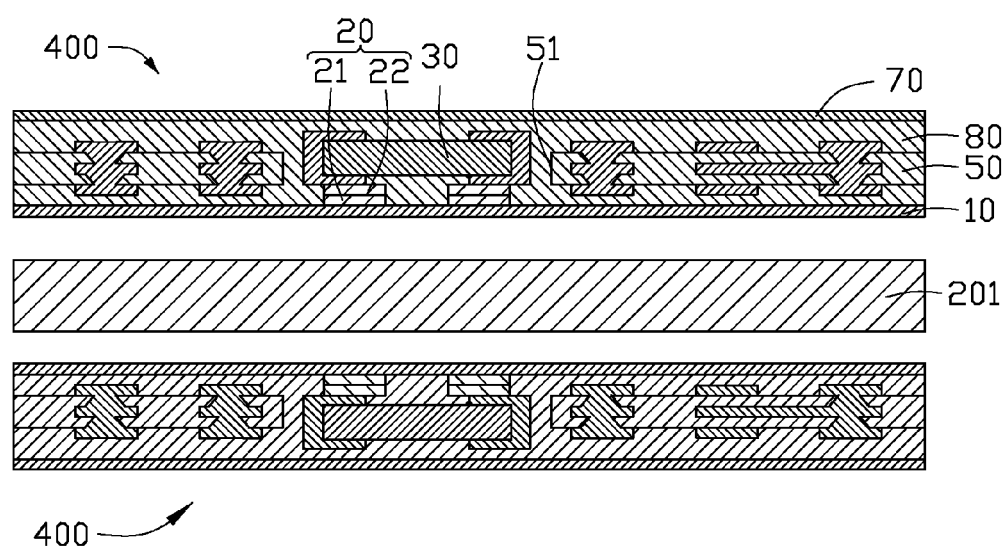
FIG. 10 is a diagrammatic view of two second intermediate products formed by removing the supporting plate of FIG. 9.

At block 27, the supporting portion 201 of the first intermediate product 300 (shown in FIG. 10) is removed to form two separate second intermediate products 400.

Figure 11:
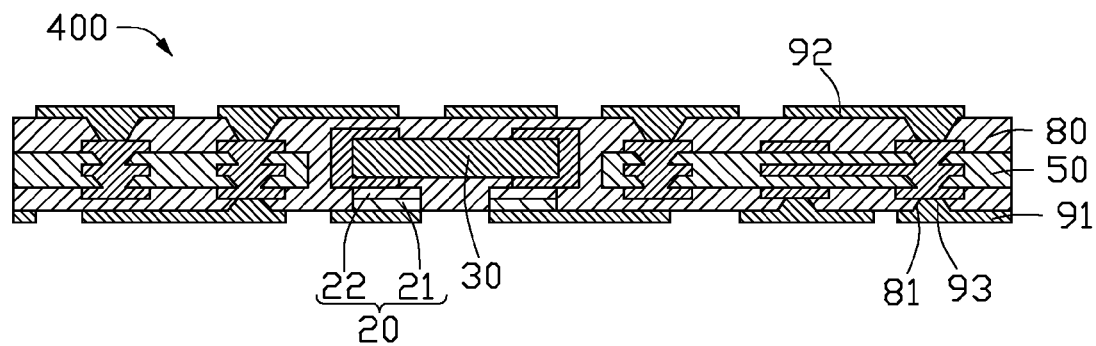
FIG. 11 is a diagrammatic view of a first conductive wire layer and a second conductive wire layer being formed by the first copper layer and the second copper layer included in one second intermediate product of FIG. 10.

At block 28, a number of plating holes 81 (shown in FIG. 11) are defined on a portion of the first copper layer 10 and the second copper layer 70, and a corresponding portion of the resin packing layer 80 included in each second intermediate product 400, and a conductive portion 93 is formed in each plating hole 81 which is electrically connected to the first copper layer 10, the second copper layer 70, and the core layer 50. The first copper layer 10 and the second copper layer 70 are further etched to form conductive wires, thereby forming the first conductive wire layer 91 and the second conductive wire layer 92, respectively. The first conductive wire layer 91 and the second conductive wire layer 92 are electrically connected to the core layer 50 via the conductive portions 93.

At block 29, the solder mask layer 101 is connected to a surface of each of the first conductive wire layer 91 and the second conductive wire layer 92 away from the core layer 50, and a number of openings 1010 are defined in each solder mask layer 101 to form the circuit board 100.

In other embodiments, a number of conductive wire layers (not shown) may be connected to a surface of each of the first conductive wire layer 91 and the second conductive wire layer 92 away from the core layer 50 by a build-up method, thereby forming a circuit board 100 comprising a number of conductive wire layers (not shown).

It is noteworthy that although the supporting plate 200 comprising two first copper layers 10 are used to obtain two second intermediate products 400, in other embodiments, a supporting plate 200 comprising only one first copper layer 10 can also be used. In this embodiment, only one second intermediate product 400 is obtained.

Figure 12:
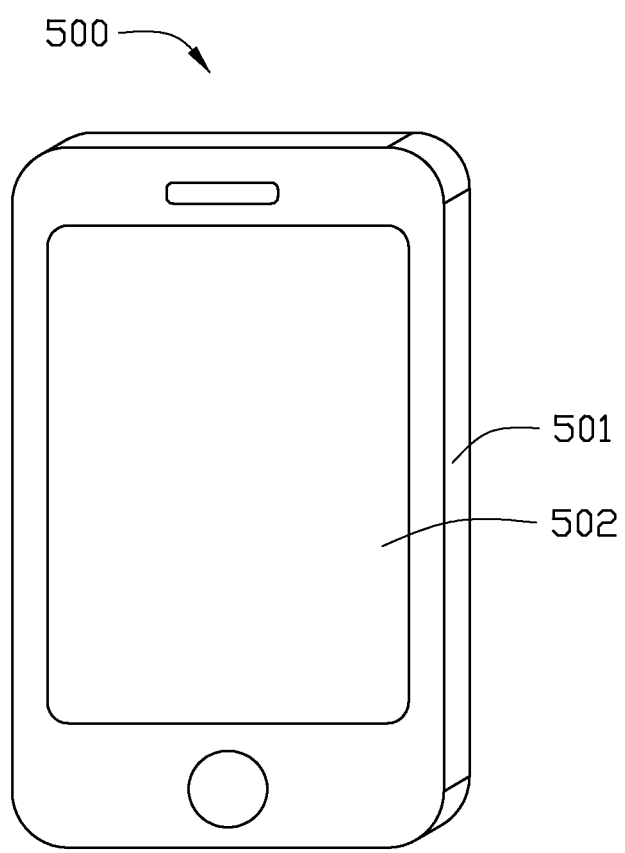
FIG. 12 is a diagrammatic view of a portable electronic device including the circuit board of FIG. 1.

FIG. 12 illustrates a portable electronic device 500 comprising the circuit board 100. The portable electronic device 500 further comprises a casing 501, a display screen 502 mounted to the casing 501, and a receiving space (not shown) cooperatively defined by the casing 501 and the display screen 502. The circuit board 100 is fixedly received in the receiving space.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for making a circuit board comprising:
   providing a supporting plate comprising a supporting portion and at least one first copper layer connected to at least one surface of the supporting portion;
   connecting at least one contact pad to a surface of each of the at least one first copper layer away from the supporting portion;
   connecting at least one passive component to a surface of each of the at least one contact pad away from the first copper layer;
   forming a first resin layer on a portion of each of the at least one first copper layer besides the passive component;
   disposing a core layer defining at least one through hole on a surface of each first resin layer away from the first copper layer to allow the passive component to be received in the through hole, and disposing a second resin layer and a second copper layer successively on each core layer and the passive component;
   pressing the two second copper layer causing the supporting portion, the first copper layer, the contact pad, the passive component, the first resin layer, the core layer, the second resin layer, and the second copper layer to be connected to each other to form a first intermediate product, wherein the first resin layer and the second resin layer flows to fill gaps between the first copper layer, the contact pad, the passive component, the core layer, and the second copper layer, thereby connecting to each other to from a resin packing layer;
   removing the supporting portion of the first intermediate product to form at least one second intermediate product;
   defining a plurality of plating holes at a portion of the first copper layer and the second copper layer, and a corresponding portion of the resin packing layer comprised in each of the at least one second intermediate product, an end of each of the plurality of plating holes being closed by one surface of the core layer; and
   forming a conductive portion in each of the plurality of plating holes which is electrically connected to the first copper layer, the second copper layer, and the core layer; and
   etching the first copper layer and the second copper layer to form a first conductive wire layer and a second conductive wire layer.

2. The method of claim 1, wherein after the step of "etching the first copper layer and the second copper layer to form a first conductive wire layer and a second conductive wire layer" further comprises:
   connecting a solder mask layer to a surface of each of the first conductive wire layer and the second conductive wire layer away from the core layer; and
   defining a plurality of openings at each solder mask layer.

3. The method of claim 1, wherein the step of "connecting at least one contact pad to a surface of each of the at least one first copper layer away from the supporting portion" further comprises:
   forming an electro-plating layer on the surface of the first copper layer by electro-plating; and
   forming a conductive paste layer on a surface of the electro-plating layer away from the first copper layer by coating a conductive paste, thereby forming the contact pad comprising the electro-plating layer and the conductive paste layer.

4. The method of claim 1, wherein the first resin layer is made of an adhesive resin composition; the adhesive resin composition comprises adhesive resin selected from a group consisting of polypropylene, polyurethane, phenolic resin, urea-formaldehyde resin, melamine-formaldehyde resin, and polyimide, or any combination thereof.

5. The method of claim 1, wherein the second resin layer is made of an adhesive resin composition; the adhesive resin composition comprises adhesive resin selected from a group consisting of polypropylene, polyurethane, phenolic resin, urea-formaldehyde resin, melamine-formaldehyde resin, and polyimide, or any combination thereof.

* * * * *